United States Patent
Teoh et al.

(12) 
(10) Patent No.: US 6,210,079 B1
(45) Date of Patent: *Apr. 3, 2001

(54) FEEDER SYSTEM AND METHOD FOR SUPPLYING ELECTRICAL COMPONENTS TO A PICK UP LOCATION

(75) Inventors: Ping Chow Teoh, Kedah; Ka Tiek Lim; Kam Wai Lee, both of Penang, all of (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,264

(22) Filed: Jun. 16, 2000

Related U.S. Application Data

(63) Continuation-in-part of application No. 09/127,941, filed on Aug. 3, 1998, now Pat. No. 6,116,821.

(51) Int. Cl.[7] .................................................. B65G 51/16
(52) U.S. Cl. ................................. 406/12; 406/28; 406/85
(58) Field of Search ................................ 406/10, 12, 28, 406/29, 31, 83, 85, 93, 107, 108, 112, 119, 122, 137, 176, 180, 194

(56) References Cited

U.S. PATENT DOCUMENTS

| | | | |
|---|---|---|---|
| 1,553,476 | 9/1925 | Schuster | 406/93 |
| 2,806,781 | 9/1957 | Shepherd et al. | 406/93 |
| 4,801,044 | 1/1989 | Kubota et al. | 221/163 |
| 5,570,812 | 11/1996 | Ando et al. | 221/233 |
| 6,024,208 | 2/2000 | Chooi et al. | 198/534 |
| 6,039,512 | 3/2000 | Chooi et al. | 406/85 |

*Primary Examiner*—Christopher P. Ellis
*Assistant Examiner*—Joe Dillon, Jr.
(74) *Attorney, Agent, or Firm*—Dale W. Dorinski

(57) ABSTRACT

A feeder system (1) for supplying electrical components (20) to a pick-and-place machine (14). The feeder system has a two storage hoppers (2a,2b) respective storage outlets (6a, 6b), There is a pick up location (3) and a passage (4) provides communication between the storage outlets (6a,6b) and the pick up location (3). A first fluid jet outlet 31 associated with storage outlets (6a,6b) provides fluid blasts to agitate components (20) the hoppers (2a,2b). A second fluid jet outlet (32) associated provides fluid blasts to propel the components (20) towards the pick up location (3).

2 Claims, 2 Drawing Sheets

FEEDER SYSTEM AND METHOD FOR SUPPLYING ELECTRICAL COMPONENTS TO A PICK UP LOCATION

CROSS REFERENCE TO RELATED APPLICATIONS

This is a continuation-in-part of application Ser. No. 09/127,941, filed Aug. 3, 1998, now U.S. Pat. No. 6,116,821, and assigned to Motorola Malaysia SDN BHD.

FIELD OF THE INVENTION

This invention relates to a feeder system and method for supplying electrical components to a pick up location. The invention is particularly useful for, but not necessarily limited to, supplying surface mountable electrical components, stored in hoppers, to pick up locations for subsequent mounting to a circuit board.

BACKGROUND ART

Component feeding is a well-known process in Surface Mounting Technology (SMT). In general, a feeder is used to sequentially supply surface mountable electrical components to a pick up location for subsequent placing, by a pick-and-place machine, onto a Printed Circuit Board (PCB) which is pre-printed with solder paste.

One form of feeder is a tape and reel feeder in which the electrical components are packaged on a tape that is wound onto a reel. The tape comprises individual pockets each containing one of the electrical components that are individually sealed in the pockets by a covering of thin film. In use, the film is removed when the tape enters the pick up location therefore leaving a pocket containing one of the electrical components in a position accessible by the pick-and-place machine. Unfortunately, the tape is substantially wider than the components located in the pockets thereby increasing the width of the feeder. Further, the reel and apparatus for removing the film also add to the width and overall size of the feeder.

Hopper feeders also known as bulk or tube feeders are an alternative to tape and reel feeders. Hopper feeders usually comprise a hopper in communication, along a downwardly sloping passage, with the pick up location. The downwardly sloping passage makes use of gravity for supplying the components to the pick up location. To further assist the supplying of the components to the pick up location a combination of gravity and air blasting has also been used. However, the components can sometimes be removed from the pick up location faster than they can be supplied especially when high speed carousel or rapid pick up robot arms are used for removing the components from the pick up location. This can result in an undesirable delay as it can reduce the efficiency of the pick-and-place machine which may have to wait for components to be delivered to the pick up location.

SUMMARY OF THE INVENTION

It is an aim of this invention to overcome or alleviate at least one of the problems associated with prior art feeder systems and methods for supplying components to a pick up location.

According to one aspect of this invention there is provided a feeder system for supplying electrical components to a pick-and-place machine, the feeder system comprising:
at least one component storage means with two or more storage outlets;
a pick up location;
a passage providing communication between said storage outlets and said pick up location;
a first fluid jet outlet associated with one or more of said storage outlets for providing fluid blasts to agitate components in said component storage means; and
a second fluid jet outlet associated with said passage for providing fluid blasts to propel said components located in said passage towards said pick up location.

Suitably, said first fluid jet outlet may be located to provide air blasts through at least a first and second one of said storage outlets.

Suitably, said first fluid jet outlet may be located in a wall of said passage.

Preferably, said second fluid jet outlet may be located in a wall of said passage.

Preferably, there may be pressurised air supply means operatively coupled to said first and second fluid jet outlets by respective valves.

Alternatively, there may be a third fluid jet outlet, wherein said first fluid jet outlet is located to provide air blasts through at least a first one of said storage outlets, and said third fluid jet outlet is located to provide air blasts through at a second one of said storage outlets.

Suitably, there may be a controller for selectively controlling said valves to alternately supply air blasts to said first and third fluid outlets.

Preferably, said passage may comprise an upwardly inclined portion which is upwardly inclined towards said pick up location.

Suitably, an end of said upwardly inclined portion may be directly coupled to said pick up location.

In an alternative form there may be an intermediate portion of said passage between said pick up location and said upwardly inclined portion.

Suitably, said intermediate portion may have a component supporting surface angled relative to a component supporting surface of said upwardly inclined portion.

The said component supporting surface of said intermediate portion may be substantially aligned in a horizontal plane.

Preferably, a component supporting surface of said pick up location can be angled relative to a component supporting surface of said upwardly inclined portion. The said component supporting surface of said pick up location may be substantially aligned in a horizontal plane.

Suitably, said passage may include a first portion providing communication between said storage means and upwardly inclined portion, wherein a length of said first portion is angled relative to said upwardly inclined portion.

Preferably, said storage means may be at least two hoppers, each hopper being associated with one of said storage outlets.

Suitably, each of said hoppers may comprise a first funnel portion for guiding components into a second funnel portion,
wherein said second funnel portion is adapted to receive said components such that a surface thereof is aligned to an alignment plane,
and wherein said second funnel portion is adapted to funnel said components into said hopper outlet.

According to another aspect of this invention there is provided a method for supplying electrical components to a pick-and-place machine by a feeder system having a component storage means with two or more storage outlets coupled by a passage to a pick up location, the method comprising the steps of:
providing air blasts to a first fluid jet outlet associated with said storage outlets to agitate said electrical components stored in said component storage means, the agitation thereof allowing for the possibility of one or more components to pass through said storage outlets and into said passage; and supplying air blasts to a second fluid jet outlet associated with said passage thereby propelling said components located in said passage towards said pick up location.

According to another aspect of this invention there is provided a method for supplying electrical components to a pick-and-place machine by a feeder system having a component storage means with two or more storage outlets coupled by a passage to a pick up location, the method comprising the steps of:

providing air blasts to a first fluid jet outlet associated with a first one of said storage outlets to agitate said electrical components stored in said component storage means, the agitation thereof allowing for the possibility of one or more components to pass through said first one of said storage outlets and into said passage;

alternately supplying air blasts to third fluid jet outlet associated with a second one of said storage outlets to agitate said electrical components stored in said component storage means, the agitation thereof allowing for the possibility of one or more components to pass through said second one of said storage outlets and into said passage; and supplying air blasts to a second fluid jet outlet associated with said passage thereby propelling said components located in said passage towards said pick up location.

BRIEF DESCRIPTION OF THE DRAWINGS

In order that the invention may be readily understood and put into practical effect, reference will now be made to preferred embodiments illustrated in the accompanying drawings in which.

DETAILED DESCRIPTION OF THE PREFERRED EMBODIMENTS OF THE INVENTION

Figure 1:
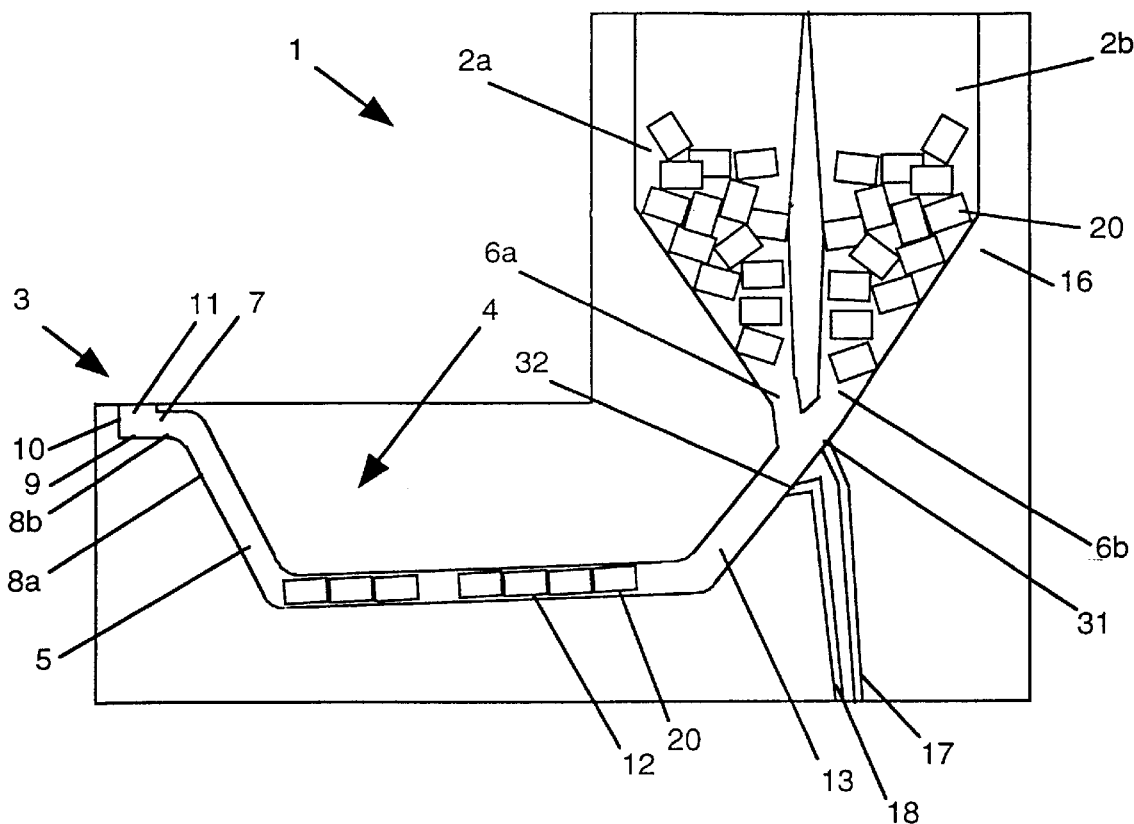
FIG. 1 is a side view of a preferred embodiment of a feeder system in accordance with this invention.
Figure 2:
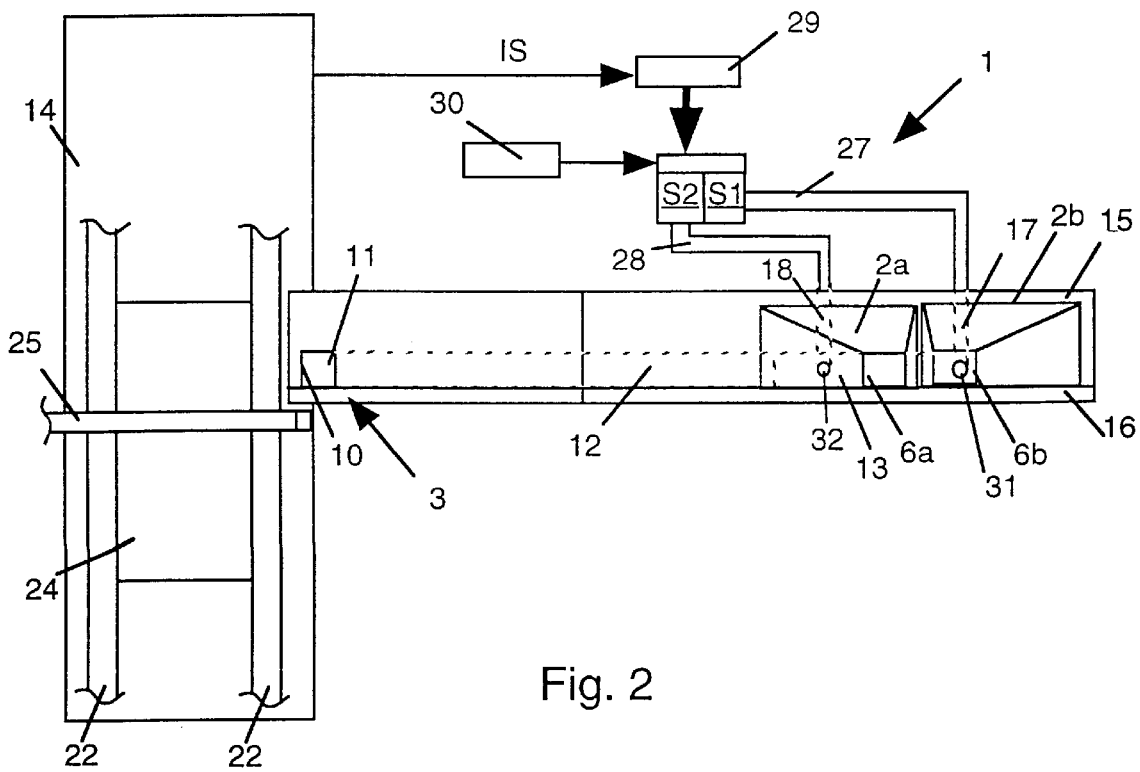
FIG. 2 is a plan view of the feeder system of FIG. 1 when incorporated into a feeder system mounted adjacent a conveyor track of a pick and place machine.

Referring to FIGS. 1 and 2 there is illustrated a feeder system 1 for supplying electrical components 20 to pick-and-place machine 14. The feeder system 1 comprises a storage means in the form of two hoppers 2a,2b, a pick up location 3 with respective storage outlets 6a,6b and a passage 4. The passage 4 provides communication between the storage outlets 6a,6b and the pick up location 3 so that electrical components 20 in hoppers 2a,2b can transferred to the pick up location 3.

The passage 4 comprises an upwardly inclined portion 5 that is upwardly inclined towards the pick up location 3. The passage 4 has an intermediate portion 7 between the pick up location 3 and the upwardly inclined portion 5. The intermediate portion 7 has a component supporting surface 8b in a horizontal plane angled relative to a component supporting surface 8a of the upwardly inclined portion 5.

The pick up location 3 has a component supporting surface 9 that is aligned with surface 8b. There is also an abutment wall 10 for stopping and positioning the components 20 and an access aperture 11 allows removal of the components 20, by the pick-and-place machine 14 from the pick up location 3.

The passage 4 also has a first portion 12 and second portion 13 angled relative to each other. The second portion 13 is coupled at one end to outlets 6a,6b and at the other end of second portion 13 is coupled to an end of the second portion 12. The other end of the second portion 12 is coupled to an end of the upwardly inclined portion 5 and the first portion 12 is angled relative to the upwardly inclined portion 5.

There is a first fluid jet outlet 31 associated with and located to provide air blasts through storage outlets 6a,6b to allow for agitating the components 20 in hoppers 2a,2b so that some of them may drop into the passage 4. There is second fluid jet outlet 32 associated with the passage 4, for propelling the components 20 that have dropped into the passage 4 towards the pick up location 3. As illustrated the first and second fluid jet outlets 31,32 are in a wall of passage 4 and they are coupled to respective air conduits 17,18 which allow for air to be supplied respectively to fluid jet outlets 31,32. The passage 4, pick up location 3, hoppers 2a,2b and air conduits 17,18 are machined into a surface of a block 15 and enclosed by a transparent plate 16 that is glued and bolted to the block 15 (bolts not shown).

As specifically illustrated in FIG. 2, the conduits 17,18 are operatively coupled to respective solenoid valves S1,S2 by flexible piping 27,28. The solenoid valves S1,S2 selectively allow for coupling of piping 27,28 to a pressurised air supply means in the form of a compressor 30. There is also a controller 29 associated with the pick and place machine 14 for use in selectively controlling the solenoid valves S1,S2.

The feeder system 1 is located adjacent a conveyor track 22 of the pick-and-place machine 14. The conveyor track 22 is used to transport a printed circuit board 24 to a position near the pick up locations 3 so that a robot arm 25 (or some other pick up device such as a carousel) can remove the components 20 in the location 3 via the access aperture 11. The robot arm 25 sequentially places the components onto the board 24 in their required positions. Although only one feeder system 1 is illustrated, it will be apparent to a person skilled in the art that a plurality of feeder systems 1 can be mounted side by side and the conduits 17,18 of each feeder system 1 would typically be operatively coupled to further solenoid valves that are selectively controllable by controller 29.

In operation the controller 29 will control solenoid valves S1,S2 to allow pulsed air blasts to be provided alternatively through fluid jet outlet 31 and fluid jet outlet 32. Accordingly, after each air blast through the first fluid jet outlet 31, one or more components 20 may drop through the storage outlets 6a,6b and into the passage 4. Similarly, after each air blast through the second fluid jet outlet 32, some of the components 20 that have dropped into passage 4 will be propelled along the passage 4 and up the upwardly inclined portion 5. Further, if there is available space, a leading one of the components 20 in the queue will be pushed into the intermediate portion 7. However, upon completion of each alternate air blast through fluid jet outlet 32, some of the components 20 will slide down the inclined portion 5 due to the effects of gravity.

When there is no component located in pick up location 3, the next air blast through fluid jet outlet 32 will push the leading one of the components 20 into location 3. This leading component will abut wall 10 and be positioned underneath the access aperture 11 ready for removal by pick-and-place machine 14. Further, if there is a component 20 located in the intermediate portion 7, this will push against, and assist in, maintaining positioning of the leading component against the wall 10. This positioning allows for the leading component to be removed from the pick up location 3 with reduced friction against wall 10. This is because the inclined portion 5 effectively separates the bulk of components 20 in passage 4 from this leading component.

Figure 3:
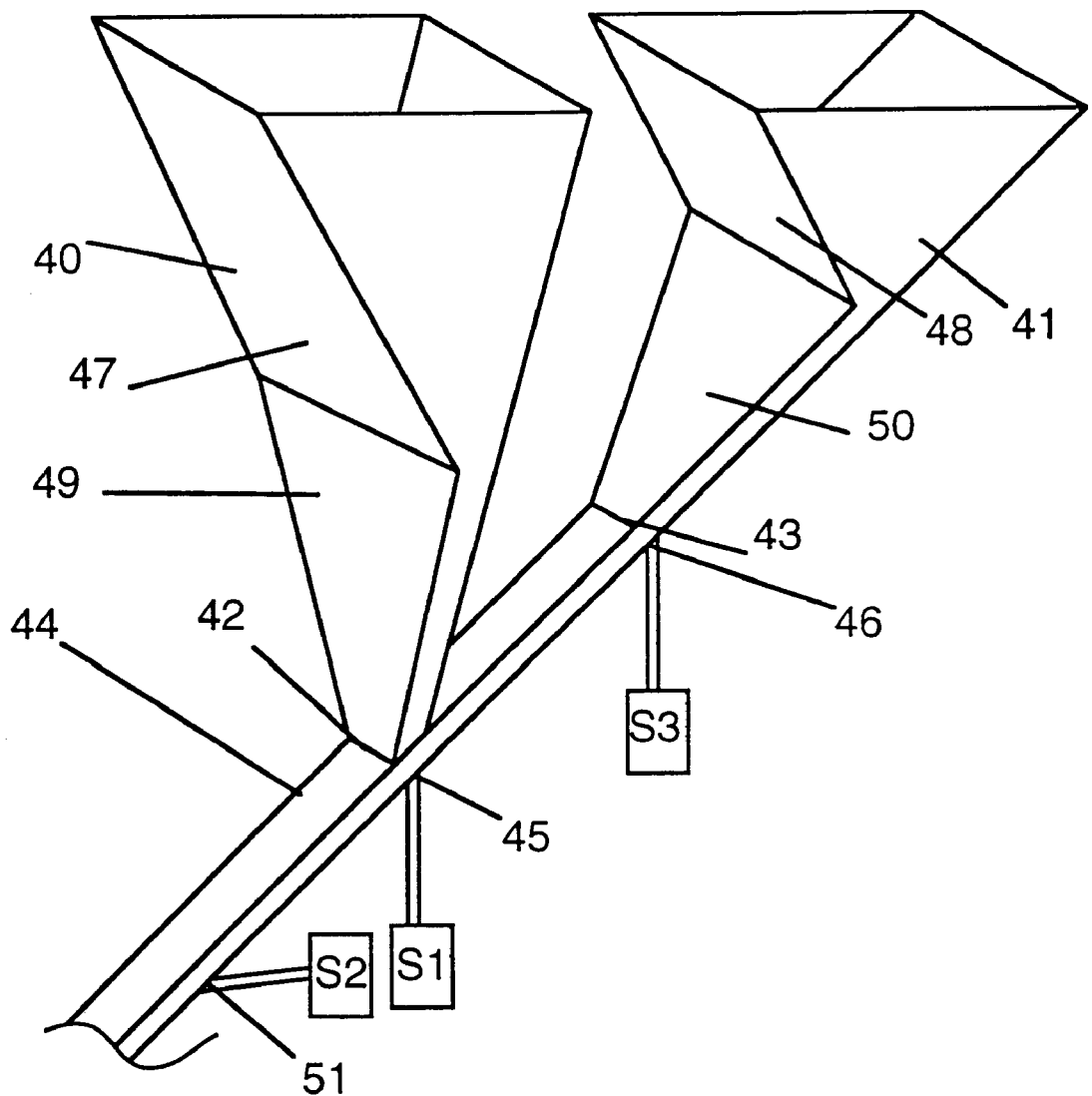
FIG. 3 is a perspective view of a second preferred embodiment of part of a feeder system in accordance with this invention.

Referring to FIG. 3 there is illustrated a second embodiment of the invention. In this regard, only the differences from the embodiment of FIGS. 1 and 2 will be described to avoid repetition. In FIG. 3 part of a hopper feeder system is shown and comprises two hoppers 40, 41 with a respective first funnel portion 47,48 for guiding components into a respective second funnel portion 49,50. The hoppers 40,41 are adapted to receive the components 20 such that one surface of each hopper is aligned in an alignment plane. Further, the second funnel portion 49,50 of the respective hoppers 40, 41 is shaped to funnel the components into respective storage outlets 42,43. There are first and third fluid jet outlets 45, 46 associated with and adjacent respective the storage outlets 42,43. In addition, there is a second fluid jet outlet 51 associated and located in a passage 44, this passage 44 having an end coupled to outlets 42,43 and the other end of the passage 44 is coupled to a pick up location as will be apparent to a person skilled in the art.

The fluid jet outlets 45,46,51 are operatively coupled to respective controllable solenoid valves S1,S3,S3. In use, S1 allows compressed air to be supplied to fluid jet outlet 45 thereby agitating components 20 in hopper 40, then S3 allows compressed air to be supplied to fluid jet outlet 46 thereby agitating components 20 in hopper 41. This agitating of components 20 in hoppers 40,41 may provide for some components to drop into passage 44. Thus, by S2 allowing air blasts to be provided to fluid jet outlet 51, components in passage 44 may be propelled towards the pick up location. The controller 29 has a number of functions. In one mode, it operates as a timer by sending a number of signals to the associated solenoid valves, thereby pulsing the air blasts to the first and third fluid jet outlets 45, 46. Preferably, the air blasts are pulsed in an alternating fashion, that is, for example, the first fluid jet outlet 45 is pulsed by opening the solenoid valve S1 for a predetermined period of time (typically 0.2 to 0.5 seconds) in order to agitate the components in the first hopper 40. When the predetermined period of time has elapsed, the solenoid valve S1 is closed. Then, after a second predetermined amount of time (from a number greater than 0 to several seconds, depending on the speed requirements of the machine and/or configuration of the components in the feeder) the other fluid jet outlet 46 is pulsed by opening the solenoid valve S3 for a predetermined period of time (typically 0.2 to 0.5 seconds) in order to agitate the components in the other hopper 41. Note that the duration and composition of the pulsing cycles for the two fluid jet outlets 45, 46 can be the same or different. The parameters of the alternation cycles are, of course, selectable by the user to optimize the component picking and the assembly process in the machine. In one version of this alternate embodiment, starting and stopping the timing sequences of the controller 29 is implemented when a workpiece 24 (the printed circuit board to be assembled) is conveyed into or out of the machine by the conveyor track 22. When the workpiece is sensed entering or leaving, an index signal is sent to the controller 29 by a sensor (represented by "IS" in FIG. 2), telling it to start or stop the pulsing cycle. One can also pulse the fluid jets for a predetermined number of cycles, then stop the pulsing for a period of time, then start again, so as to maintain a component ready at pick up point 11. Thus, the controller 29 controls the activation of the solenoid valves and the subsequent blasts of air by acting both as a timer and as a controller that sends and receives signals to and from other sensors and devices on the pick-and-place machine.

The present invention, as will be apparent to a person skilled in the art, increases the likelihood of more components 20 entering passage 4 and being supplied to the pick up location 3. Accordingly, this advantageously reduces the possibility of the pick and place machine 14 having to wait for components 20 to be delivered to the pick up location 3.

Although this invention has been described with reference to a preferred embodiment, it is to be understood that the invention is not limited to the specific embodiment described herein. For instance, the controller 31 could be incorporated into circuitry of the pick and place machine and the hoppers 2a,2b could be a single hopper with two outlets. Further, the sequence of air blasts through outlets 45, 46, 51 of FIG. 3 may be altered and still provide a similar result.

We claim:

1. A feeder system for supplying electrical components to a pick-and-place machine, the feeder system comprising:

first and second component means for storage, each having a storage outlet;

a pick up location;

a passage providing communication between said storage outlets and said pick up location;

a first fluid jet outlet associated with the first of said storage outlets for providing fluid blasts to agitate components in the first component storage means, wherein said first fluid jet outlet is located to provide air blasts through the first storage outlet;

a second fluid jet outlet associated with said passage for providing fluid blasts to propel said components located in said passage towards said pick up location;

a third fluid jet outlet associated with the second of said storage outlets for providing fluid blasts to agitate components in the second component storage means, wherein said third fluid jet outlet is located to provide air blasts through the second storage outlet;

a first solenoid valve and a third solenoid valve each arranged to provide air to respective said first and third fluid jet outlets; and a controller for selectively controlling said solenoid valves to alternately supply air blasts to said first and third fluid jet outlets.

2. A method for supplying electrical components to a pick-and-place machine by a feeder system having means for storing a component with two or more storage outlets coupled by a passage to a pick up location, the method comprising the steps of:

providing air blasts to a first fluid jet outlet associated with a first one of said storage outlets to agitate said electrical components stored in said component storage means, the agitation thereof allowing for the possibility of one or more components to pass through said first one of said storage outlets and into said passage;

alternately supplying air blasts to a third fluid jet outlet associated with a second one of said storage outlets to agitate said electrical components stored in said component storage means, the agitation thereof allowing for the possibility of one or more components to pass through said second one of said storage outlets and into said passage; and supplying air blasts to a second fluid jet outlet associated with said passage thereby propelling said components located in said passage towards said pick up location.

* * * * *